United States Patent
Lindert et al.

(10) Patent No.: US 9,691,839 B2
(45) Date of Patent: Jun. 27, 2017

(54) METAL-INSULATOR-METAL (MIM) CAPACITOR WITH INSULATOR STACK HAVING A PLURALITY OF METAL OXIDE LAYERS

(75) Inventors: Nick Lindert, Beaverton, OR (US); Timothy E. Glassman, Portland, OR (US); Andre Baran, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 366 days.

(21) Appl. No.: 13/996,494

(22) PCT Filed: Dec. 14, 2011

(86) PCT No.: PCT/US2011/064972
§ 371 (c)(1),
(2), (4) Date: Jun. 20, 2013

(87) PCT Pub. No.: WO2013/089711
PCT Pub. Date: Jun. 20, 2013

(65) Prior Publication Data
US 2013/0270676 A1   Oct. 17, 2013

(51) Int. Cl.
*H01L 27/108* (2006.01)
*H01L 49/02* (2006.01)

(52) U.S. Cl.
CPC ............ *H01L 28/40* (2013.01); *H01L 27/108* (2013.01); *H01L 27/10808* (2013.01);
(Continued)

(58) Field of Classification Search
CPC ................................. H01L 28/40; H01L 28/56
(Continued)

(56) References Cited

U.S. PATENT DOCUMENTS 6,320,244 B1 * 11/2001 Alers .................. H01L 27/1085
257/532
6,875,667 B2 * 4/2005 Iizuka ............... H01L 27/10811
257/E21.019
(Continued)

FOREIGN PATENT DOCUMENTS

CN       102148261     8/2011
KR    1020000053454    8/2000

OTHER PUBLICATIONS

International Search Report and Written Opinion for PCT Patent Application No. PCT/US2011/064972 Mailed Sep. 3, 2012, 9 Pages.
International Preliminary Report on Patentability from PCT/US2011/064972 mailed Jun. 26, 2014, 6 pgs.
Search Report from Taiwan Patent App. No. 101142187 mailed Jul. 30, 2014, 1 pgs.
(Continued)

*Primary Examiner* — Mark Prenty
(74) *Attorney, Agent, or Firm* — Blakely, Sokoloff, Taylor & Zafman LLP

(57) ABSTRACT

Metal-insulator-metal (MIM) capacitors with insulator stacks having a plurality of metal oxide layers are described. For example, a MIM capacitor for a semiconductor device includes a trench disposed in a dielectric layer disposed above a substrate. A first metal plate is disposed along the bottom and sidewalls of the trench. An insulator stack is disposed above and conformal with the first metal plate. The insulator stack includes a first metal oxide layer having a first dielectric constant and a second metal oxide layer having a second dielectric constant. The first dielectric constant is higher than the second dielectric constant. The MIM capacitor also includes a second metal plate disposed above and conformal with the insulator stack.

37 Claims, 7 Drawing Sheets

(52) U.S. Cl.
CPC ........ *H01L 27/10852* (2013.01); *H01L 28/75* (2013.01); *H01L 28/90* (2013.01)

(58) Field of Classification Search
USPC .................. 257/532, 303, 306, 310; 438/240
See application file for complete search history.

(56) References Cited

U.S. PATENT DOCUMENTS

| | | |
|---|---|---|
| 7,271,055 B2 | 9/2007 | Lee et al. |
| 7,880,268 B2 * | 2/2011 | Cremer .................. H01L 28/91 |
| | | 257/532 |
| 2004/0072401 A1 | 4/2004 | Iizuka et al. |
| 2006/0040457 A1 | 2/2006 | Lee et al. |
| 2007/0045689 A1 | 3/2007 | Lim et al. |
| 2011/0233722 A1 | 9/2011 | Liang et al. |

OTHER PUBLICATIONS

First Office Action Chinese Patent App. No. 201180076377.X mailed Apr. 25, 2016, 12 pages.
Preliminary Rejection for Korean Patent App. No. 10-2014-7016244, mailed Jul. 20, 2015, 8 pages.
Preliminary Rejection for Korean Patent App. No. 10-2014-7016244, mailed Apr. 7, 2016, 5 pages.
Final Rejection for Korean Patent App. No. 10-2014-7016244, mailed Jan. 28, 2016, 3 pages.
Office Action for Chinese Patent Application No. 201180076377.X, mailed Oct. 26, 2016, 10 pgs.
Office Action for Chinese Patent Application No. 201180076377.X, mailed May 3, 2017, 3 pgs.

* cited by examiner

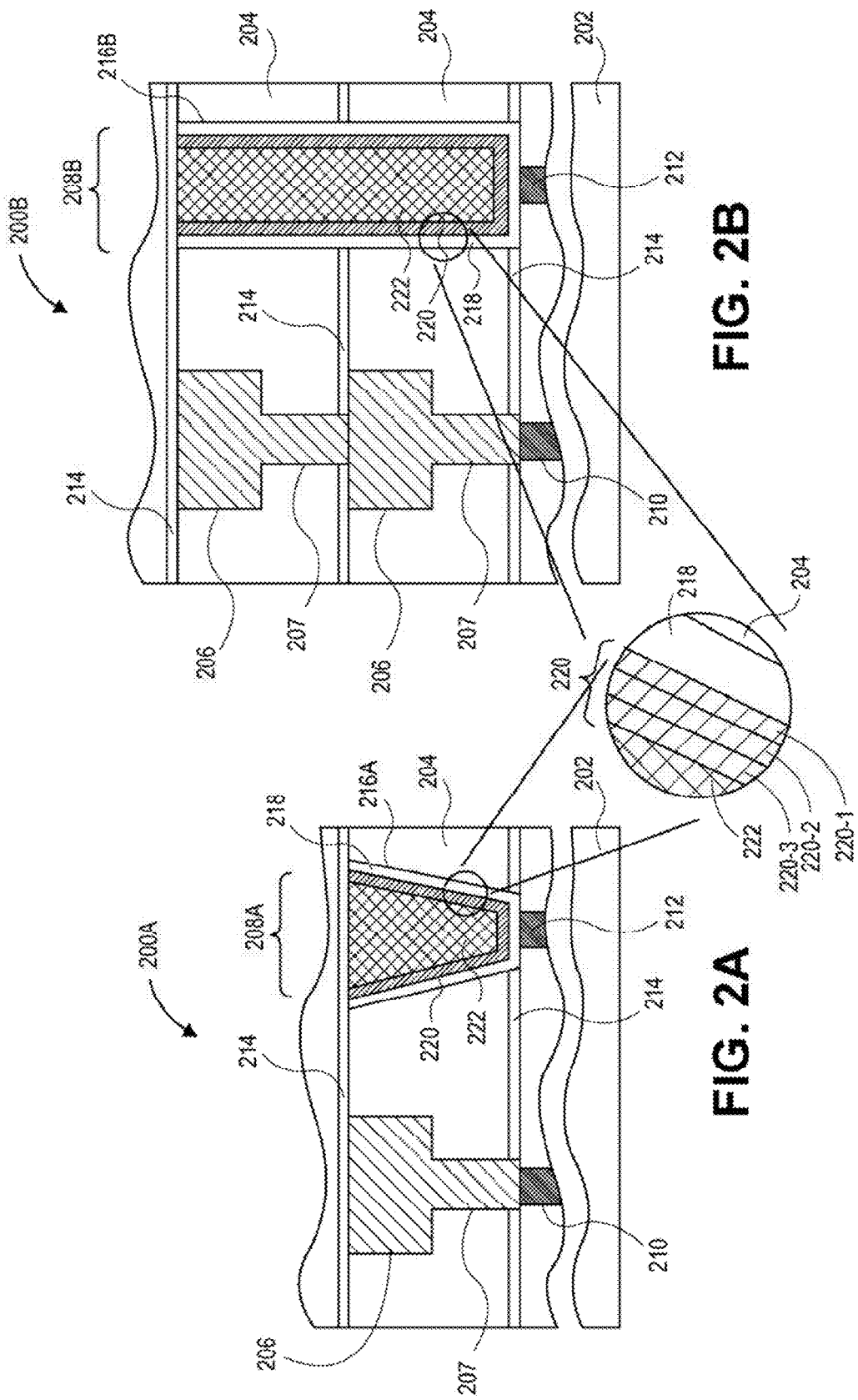

METAL-INSULATOR-METAL (MIM) CAPACITOR WITH INSULATOR STACK HAVING A PLURALITY OF METAL OXIDE LAYERS

CLAIM OF PRIORITY

This application is a U.S. National Phase application under 35 U.S.C. §371 of International Application No. PCT/US 11/64972, filed Dec. 14, 2011, entitled "METAL-INSULATOR-METAL (MIM) CAPACITOR WITH INSULATOR STACK HAVING A PLURALITY OF METAL OXIDE LAYERS," the entire contents of which are incorporated herein by reference.

TECHNICAL FIELD

Embodiments of the invention are in the field of dynamic random access memory and, in particular, metal-insulator-metal (MIM) capacitors with insulator stacks having a plurality of metal oxide layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

In semiconductor devices such as DRAMs (Dynamic Random Access Memory), each cell is composed of one transistor and one capacitor. In DRAMs, cells require periodic reading and refreshing. Owing to the advantages of low price-per-unit-bit, high integration, and ability to simultaneously perform read and write operations, DRAMs have enjoyed widespread use in commercial applications. In the meantime, a phenomenon referred to as "soft error" can be caused in DRAM devices by a loss of charge that was stored in a capacitor due to external factors, thereby causing malfunction of DRAMs. In order to prevent the occurrence of soft error, a method of enhancing the capacitance of a capacitor has been suggested. However, challenges are presented in formulating practical manufacturing processes due to the ever increasing high level of integration of semiconductor devices.

Furthermore, metal lines are typically integrated in layers separate from capacitor layers. In an example, a copper metal layer is formed above a group of capacitors and is not run in the same layer as the capacitors. FIG. 1 represents such an example where vias of metal lines are formed through capacitor dielectric layers to connect the upper metal line layers to lower device layers. Specifically, FIG. 1 is a cross-sectional view of a capacitor formed in a dielectric layer distinct from a dielectric layer used to house metal wiring, in accordance with the prior art.

Referring to FIG. 1, a first interlayer insulating layer 103 is formed on a semiconductor substrate 101 having a cell array region 102. The first interlayer insulating layer 103 is patterned to form contact holes exposing the semiconductor substrate 101 on the cell array region 102 and the contact holes are filled with a conductive material to form a lower electrode contact plug 105A. An etch stop layer 107 and a second interlayer insulating layer 109 are sequentially formed on the resulting structure.

The second interlayer insulating layer 109 and the etch stop layer 107 are sequentially etched in the cell array region 102 to form the lower electrode contact plug 105A and a storage node hole 111 exposing the first interlayer insulating layer 103 around the lower electrode contact plug. After a material layer for a lower electrode is conformally stacked on the resulting structure, a planarization process is carried out to form the lower electrode 113 covering a bottom and an inner sidewall of the storage node hole 111. A dielectric layer 115 and an upper electrode layer 117 are sequentially stacked and patterned on the semiconductor substrate 101. A via 124 of a metal line 122 is formed through capacitor dielectric layers (e.g., dielectric layer 109, and even interlayer dielectric layer 120) to connect the upper metal line 122 layer to the semiconductor substrate 101 having the cell array region 102.

SUMMARY

Embodiments of the present invention include metal-insulator-metal (MIM) capacitors with insulator stacks having a plurality of metal oxide layers.

In an embodiment, a MIM capacitor for a semiconductor device includes a trench disposed in a dielectric layer disposed above a substrate. A first metal plate is disposed along the bottom and sidewalls of the trench. An insulator stack is disposed above and conformal with the first metal plate. The insulator stack includes a first metal oxide layer having a first dielectric constant and a second metal oxide layer having a second dielectric constant. The first dielectric constant is higher than the second dielectric constant. The MIM capacitor also includes a second metal plate disposed above and conformal with the insulator stack.

In another embodiment, a semiconductor structure includes a plurality of semiconductor devices disposed in or above a substrate. One or more dielectric layers is disposed above the plurality of semiconductor devices. Metal wiring is disposed in each of the dielectric layers and electrically coupled to one or more of the semiconductor devices. The semiconductor structure also includes a metal-insulator-metal (MIM) capacitor disposed in a trench disposed in at least one of the dielectric layers, adjacent to the metal wiring of the at least one of the dielectric layers. The MIM capacitor is electrically coupled to one or more of the semiconductor devices and includes a first metal plate disposed along the bottom and sidewalls of the trench. An insulator stack is disposed above and conformal with the first metal plate. The insulator stack includes a first metal oxide layer having a first dielectric constant, a second metal oxide layer having a second dielectric constant, and a third metal oxide layer having a third dielectric constant. The first and third dielectric constants are higher than the second dielectric constant. The MIM capacitor also includes a second metal plate disposed above and conformal with the insulator stack.

In another embodiment, a method of fabricating an embedded metal-insulator-metal (MIM) capacitor includes forming a trench in a dielectric layer disposed above a substrate. A first metal plate is formed along the bottom and sidewalls of the trench. A first metal oxide layer is formed above and conformal with the first metal plate. A second, different, metal oxide layer is formed above and conformal with the first metal oxide layer. A third metal oxide layer is formed above and conformal with the second metal oxide layer. A second metal plate is formed above and conformal with the third metal oxide layer.

BRIEF DESCRIPTION OF THE DRAWINGS

FIG. 2A illustrates a cross-sectional view of a capacitor formed in a single dielectric layer housing metal wiring, the capacitor having an insulator stack with a plurality of metal oxide layers, in accordance with an embodiment of the present invention.

FIG. 2B illustrates a cross-sectional view of a capacitor formed in two dielectric layers, each dielectric layer housing metal wiring, and the capacitor having an insulator stack with a plurality of metal oxide layers, in accordance with an embodiment of the present invention.

DETAILED DESCRIPTION

Figure 1:
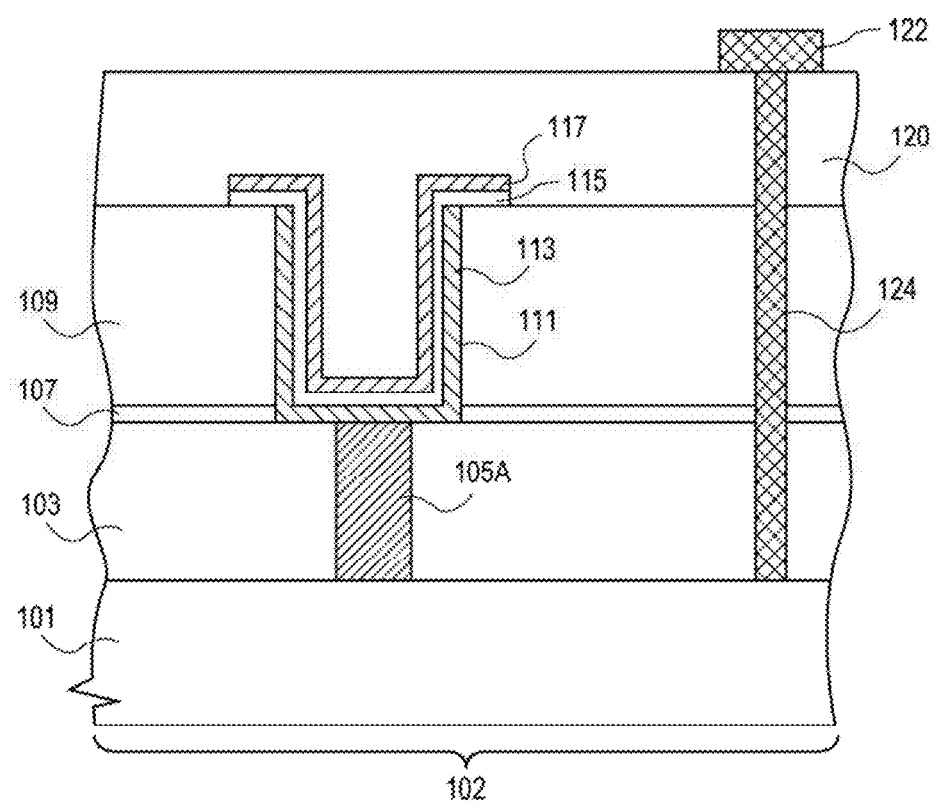
FIG. 1 is a cross-sectional view of a capacitor formed in a dielectric layer distinct from a dielectric layer used to house metal wiring, in accordance with the prior art.

Metal-insulator-metal (MIM) capacitors with insulator stacks having a plurality of metal oxide layers are described. In the following description, numerous specific details are set forth, such as specific metal wiring layer counts and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

In an embodiment, a titanium oxide layer ($TiO_x$, where x is approximately in the range of 1-2) is included in an insulator stack of a MIM capacitor. The $TiO_x$ layer may be one of several metal oxide layers and may be incorporated in the insulator stack for improving DRAM Capacitance. In one embodiment, the $TiO_x$ layer is formed by atomic layer deposition (ALD). Using a $TiO_x$ layer in addition to other metal oxide layers in the insulator stack of a MIM capacitor may increase the capacitance of the DRAM capacitor while maintaining very low leakage, which may be needed for improved memory retention time (or reduced power).

In an embodiment, an ALD $TiO_x$ layer is incorporated before and/or after a main or central high-K dielectric film of an insulator stack. Adding such a $TiO_x$ layer before and after the main or central high-K dielectric film in a capacitor suitable for eDRAM applications may provide a large improvement in the capacitance while maintaining very low leakage. The benefit may be a result of the higher dielectric constant of the $TiO_x$ layer compared to the dielectric constant of the main or central high-K dielectric film, such as a $ZrO_2$ or $HfO_2$ layer that is typically used for the true high-K dielectric of the capacitor. Alternatively, the $TiO_x$ layer may alter the dielectric constant of the main or central high-k layer growing thereon. With the higher-k of the $TiO_x$ layer also comes a smaller bandgap which may otherwise lead to increased capacitor leakage. However, in an embodiment, by still including a wide bandgap material as a main or central high-K layer (e.g., ZrO2 or HfO2) at a suitable thickness, the side effect of increased leakage may be avoided while still benefitting from the improved capacitance provided by the $TiO_x$ layer. In an embodiment, a dramatic increase (e.g., doubled) in capacitance of a MIM capacitor is achieved by inserting $TiO_x$ layers before and after an $HfO_2$ or $ZrO_2$ layer.

Thus, in one or more embodiments of the present invention, an embedded MIM capacitor has an insulator stack with multiple high-k dielectric layers. For example, FIG. 2A illustrates a cross-sectional view of a capacitor formed in a single dielectric layer housing metal wiring, the capacitor having an insulator stack with a plurality of metal oxide layers, in accordance with an embodiment of the present invention. In another example, FIG. 2B illustrates a cross-sectional view of a capacitor formed in two dielectric layers, each dielectric layer housing metal wiring, and the capacitor having an insulator stack with a plurality of metal oxide layers, in accordance with an embodiment of the present invention.

Referring to FIGS. 2A and 2B, a semiconductor structure 200A or 200B, respectively, includes a plurality of semiconductor devices disposed in or above a substrate 202. One or more dielectric layers 204 is/are disposed above the plurality of semiconductor devices in or above the substrate 202. Metal wiring 206, such as copper metal wiring, is disposed in each of the dielectric layers 204. Metal wiring 206 is electrically coupled to one or more of the semiconductor devices in or above the substrate 202. A metal-insulator-metal (MIM) capacitor 208A or 208B, respectively, is disposed in at least one of the dielectric layers 204. The MIM capacitor 208A or 208B is adjacent to the metal wiring 206 of the at least one of the dielectric layers 204 and is electrically coupled to one or more of the semiconductor devices in or above the substrate 202.

The MIM capacitor includes a cup-shaped metal plate 218 disposed along the bottom and sidewalls of the trench 216A or 216B. An insulator stack 220 is disposed on and conformal with the cup-shaped metal plate 218. A trench-fill metal plate 222 is disposed on the insulator stack 220. The insulator stack 220 isolates the trench-fill metal plate 222 from the cup-shaped metal plate 218.

In an embodiment, the insulator stack 220 includes one or more high-K dielectric layers (a layer with a dielectric constant greater than 4 for silicon dioxide), such as metal oxide layers. For example, in one embodiment, insulator stack 220 includes two or more distinct metal oxide layers, such as the three metal oxide layers 220-1, 220-2, and 220-3 depicted in FIGS. 2A and 2B.

In an embodiment, referring again to FIGS. 2A and 2B, the first metal oxide layer 220-1 has a first band gap, the second metal oxide layer 220-2 has a second band gap, and the first band gap is narrower than the second band gap. In one such embodiment, the insulator stack 220 further includes a third metal oxide layer 220-3 having a third dielectric constant and a third band gap, the third dielectric constant higher than the second dielectric constant, and the third band gap narrower than the second band gap. In a specific such embodiment, the first metal oxide layer 220-1 is disposed above the cup-shaped metal plate 218, the second metal oxide layer 220-2 is disposed above first metal oxide layer 220-1, and the third metal oxide layer 220-3 is disposed above second metal oxide layer 220-2. In a particular such embodiment, the first metal oxide layer 220-1 and the third metal oxide layer 220-3 are composed of the same material, have the same band gap, and have the same dielectric constant.

In an embodiment, the first metal oxide layer 220-1 (and, if applicable, the third metal oxide layer 220-3) is composed of titanium oxide ($TiO_x$, where x is approximately in the range of 1-2). However other suitable metal oxides may include species such as tantalum oxide ($Ta_2O_5$). In an embodiment, the second metal oxide layer 220-2 is composed of hafnium oxide ($HfO_2$), zirconium oxide ($ZrO_2$), or a combination thereof. In an embodiment, the first metal oxide layer 220-1 has a thickness approximately in the range of 0.5-20 nanometers. In an embodiment, the thickness of the second metal oxide layer 220-2 is approximately three times the thickness of the first metal oxide layer 220-1.

In an embodiment, the trench-fill metal plate 222 is composed mostly of copper. In an embodiment, the cup-shaped metal plate 218 is composed of a copper layer proximate to the bottom of the trench 216A or 216B and distal from the insulator stack 220, and is further composed of a metal nitride layer proximate to the insulator stack 220 and distal from the bottom of the trench 216A or 216B. In one embodiment, the metal nitride layer is a tantalum nitride layer or a titanium nitride layer. In an embodiment, one or more of the copper layer or the metal nitride layer of the cup-shaped metal plate 218 or the copper of the trench-fill metal plate 222 is formed by a technique such as, but not limited to, an electro-chemical deposition process, an electro-less deposition process, a chemical vapor deposition process, an atomic layer deposition (ALD) process, or a reflow process. It is to be understood that silver, aluminum, or an alloy of copper, silver or aluminum may be used in place of the above described copper. Also, the cup-shaped metal plate 218 may be a single layer feature formed from copper, silver, aluminum, or an alloy thereof. In an alternative embodiment, trench-fill metal plate 222 includes a multiple layer structure. In an embodiment, the cup-shaped metal plate 218 is electrically coupled to an underlying semiconductor device by a floor metal layer, which may be a contact or additional metal wiring layer.

It is to be understood that metal wiring 206 refers to metal lines, e.g., used as interconnect lines. Metal wiring 206 is to be distinguished from vias, e.g., vias 207, which may also be housed in dielectric layer(s) 204 and used to couple metal wirings 206 in different dielectric layers 204 or to couple a metal wiring with some other electrical contact, e.g., contacts 210. Contact 210 may represent another via, another metal wiring, or an actual contact structure formed between a via 207 and a semiconductor device. MIM capacitor 208A or 208B may be electrically coupled to one or more of the semiconductor devices in or above the substrate 202 through with some electrical contact, e.g., contacts 212. Contact 212 may represent another via, another metal wiring, or an actual contact structure formed between the bottom of MIM capacitor 208A or 208B and a semiconductor device. In an embodiment, at least a portion of the metal wiring 206 is electrically coupled to one or more semiconductor devices included in a logic circuit, and the MIM capacitor 208A or 208B is an embedded dynamic random access memory (eDRAM) capacitor. The top electrode of the MIM capacitor may be connected by a via from an interconnect or metal wiring layer above the MIM capacitor. In one embodiment, such a connection provides the common or ground connection of the eDRAM.

Referring to FIG. 2A, in one embodiment, the MIM capacitor 208A is disposed in only one of the dielectric layers 204. Referring to FIG. 2B, the MIM capacitor 208B is disposed in only two of the dielectric layers 204. In that embodiment, the MIM capacitor 208B is adjacent to the metal wiring 206 of each of the two dielectric layers 204 and also adjacent to a via 207 coupling the metal wiring 206 of each of the two dielectric layers 204. In other embodiments, a MIM capacitor is disposed in more than two of dielectric layers and is adjacent to the metal wiring of all of the more than two dielectric layers.

Referring again to FIGS. 2A and 2B, semiconductor structures 200A and 200B, respectively, further include one or more etch-stop layers 214, such as a silicon nitride, silicon oxide, or silicon oxy-nitride etch-stop layer. For example, an etch-stop layer may be disposed between each of the dielectric layers 204, and directly below the dielectric layer closest to the substrate 202, as depicted in FIGS. 2A and 2B. In an embodiment, the MIM capacitor 208A or 208B is disposed in a trench 216A or 216B, respectively, disposed in the at least one of the dielectric layers 204.

In an embodiment, the sidewalls of the trench include a vertical or near-vertical profile, e.g., the vertical or near-vertical profile of the trench 216B depicted in FIG. 2B. In another embodiment, the sidewalls of the trench taper outward from the bottom of the at least one of the dielectric layers 204 to the top of the at least one of the dielectric layers 204, e.g., the tapered profile of the trench 216A depicted in FIG. 2A. In contrast to the two embodiments shown, other embodiments include a vertical profile for a trench formed in a single dielectric layer 204 or a tapered profiled for a trench formed in two or more dielectric layers 204.

In an embodiment, the at least one of the dielectric layers 204 is a low-K dielectric layer (a layer with a dielectric constant less than 4 for silicon dioxide). In one embodiment, the at least one of the dielectric layers 204 is formed by a process such as, but not limited to, a spin-on process, a chemical vapor deposition process, or a polymer-based chemical vapor deposition process. In a specific embodiment, the at least one of the dielectric layers 204 is formed by a chemical vapor deposition process involving silane or an organo-silane as a precursor gas. In an embodiment, the at least one of the dielectric layers 204 is composed of a material that does not significantly contribute to leakage current between a series of metal interconnects subsequently formed in or on the at least one of the dielectric layers 204. In one embodiment, the at least one of the dielectric layers 204 is composed of a material in the range of 2.5 to less than 4. In a particular embodiment, the at least one of the dielectric layers 204 is composed of a material such as, but not limited to, a silicate or a carbon-doped oxide with 0-10% porosity. In another embodiment, however, the at least one of the dielectric layers 204 is composed of silicon dioxide.

In an embodiment, substrate 202 is composed of a material suitable for semiconductor device fabrication. In one embodiment, substrate 202 is a bulk substrate composed of a single crystal of a material which may include, but is not limited to, silicon, germanium, silicon-germanium or a III-V compound semiconductor material. In another embodiment, substrate 202 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 202 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxynitride. The lower bulk layer is composed of a single crystal which may include, but is not limited to, silicon, germanium, silicon-germanium, a III-V compound semiconductor material or quartz. Substrate 202 may further include dopant impurity atoms.

In accordance with an embodiment of the present invention, substrate 202 has thereon or therein an array of complimentary metal-oxide-semiconductor (CMOS) transistors fabricated in a silicon substrate and encased in a dielectric layer. A plurality of metal interconnects may be formed above the transistors, and on a surrounding dielectric layer, and are used to electrically connect the transistors to form an integrated circuit. In one embodiment, the integrated circuit is used for a DRAM.

Possible combinations of material layers for metal plates and insulator stacks of a MIM capacitor may lead to complex stacks. In a specific example, FIG. 2C illustrates a cross-sectional view of a capacitor having an insulator stack with a plurality of metal oxide layers, in accordance with an embodiment of the present invention.

Figure 2C:
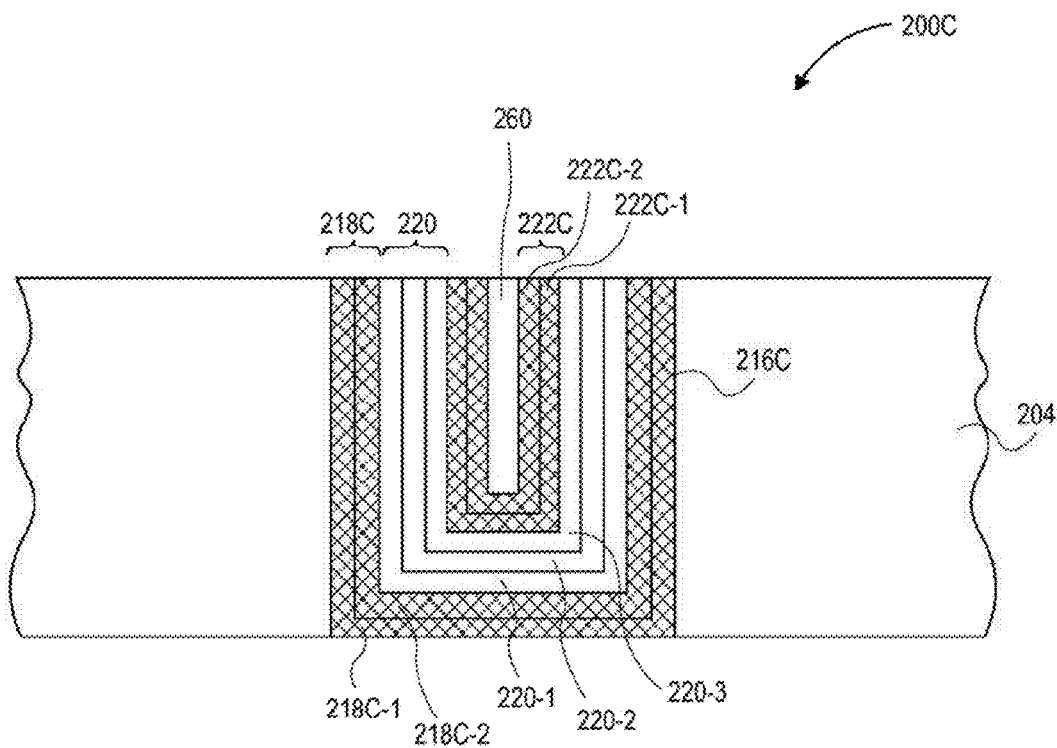
FIG. 2C illustrates a cross-sectional view of a capacitor having an insulator stack with a plurality of metal oxide layers, in accordance with an embodiment of the present invention.

Referring to FIG. 2C, a MIM capacitor 200C is disposed in a trench 216C of a dielectric layer 204. The MIM capacitor includes a first metal plate 218C composed of a first inner cup-shaped conductive layer 218C-2 disposed on a first outer cup-shaped conductive layer 218C-1. A first metal oxide layer 220-1 of an insulator stack 220 is disposed on the first inner cup-shaped conductive layer 218C-2. A second metal plate 222C is composed of a second outer cup-shaped conductive layer 222C-2 disposed on a second inner cup-shaped conductive layer 222C-1. The second inner cup-shaped conductive layer 222C-1 is disposed on a third metal oxide layer 220-3 of the insulator stack 220. A second metal oxide layer 220-2 is disposed between the first 22-10 and third 220-3 metal oxide layers of the insulator stack 220.

In one such embodiment, the first outer cup-shaped conductive layer 218C-1 is composed of tantalum (Ta), the first inner cup-shaped conductive layer 218C-2 is composed of titanium nitride (TiN), the first and third metal oxide layers 220-1 and 220-3, respectively, are each composed of titanium oxide (TiO$_x$, where x is approximately in the range of 1-2), the second metal oxide layer 220-2 is composed of hafnium oxide (HfO$_2$), zirconium oxide (ZrO$_2$), or a combination thereof, the second inner cup-shaped conductive layer 222C-1 is composed of tantalum aluminum carbide (TaAlC), and the second outer cup-shaped conductive layer 222C-2 is composed of tantalum (Ta). In a specific embodiment, the embedded MIM capacitor 200C further includes a conductive trench-fill layer 260, such as a copper or aluminum fill layer.

Conventional approaches to incorporating capacitor structures with metal wiring layers only introduces metal wirings, such as copper lines, after and above the capacitor layers. In such arrangements, the metal wiring layers do not share dielectric layers with the dielectric layers used to house the capacitor structures. Furthermore, in the conventional architectures, methods are available for increasing the height of the lower electrode as a method for increasing the surface area of the lower electrode to increase capacitance. In one such method, the thickness of a dielectric layer where the lower electrode is positioned is increased. However, if the thickness is increased, the process burden is also increases because large amount of etching is required when the metal contact hole is formed. Furthermore, since the metal wiring is not housed in the dielectric layer, such an approach creates an even greater distance between metal wiring layers and respective device layers.

In accordance with an embodiment of the present invention, a capacitor structure, e.g., for an embedded dynamic random access memory (DRAM) product, is incorporated with metal wiring layers to share one or more dielectric layers housing the metal wiring layers. For example, in one embodiment, the height of the capacitor structure is essentially the height of two metal wiring dielectric layers, and the capacitor structure is formed adjacent to the two metal wiring layers. In another embodiment, the height of the capacitor structure is essentially the height of only one metal wiring dielectric layer, and the capacitor structure is formed adjacent to the one metal wiring layer. However, the capacitor height may need to be the height of 2 or more dielectric layers in order to supply enough capacitance. The capacitor structure may be formed in the metal wiring dielectric layer(s) after formatting of the metal wiring layers. Such an approach allows embedding of a DRAM capacitor into a logic (CPU) process. By contrast, conventional approaches start with a DRAM process and add logic capability later to fabricate embedded DRAM.

In one or more embodiments of the present invention, an embedded metal-insulator-metal (MIM) capacitor, such as a capacitor described above, is included in the dielectric layer of a fourth metal wiring. For example, FIG. 3 illustrates a cross-sectional view of a capacitor formed in a single dielectric layer housing fourth-level metal wiring, in accordance with an embodiment of the present invention.

Figure 3:
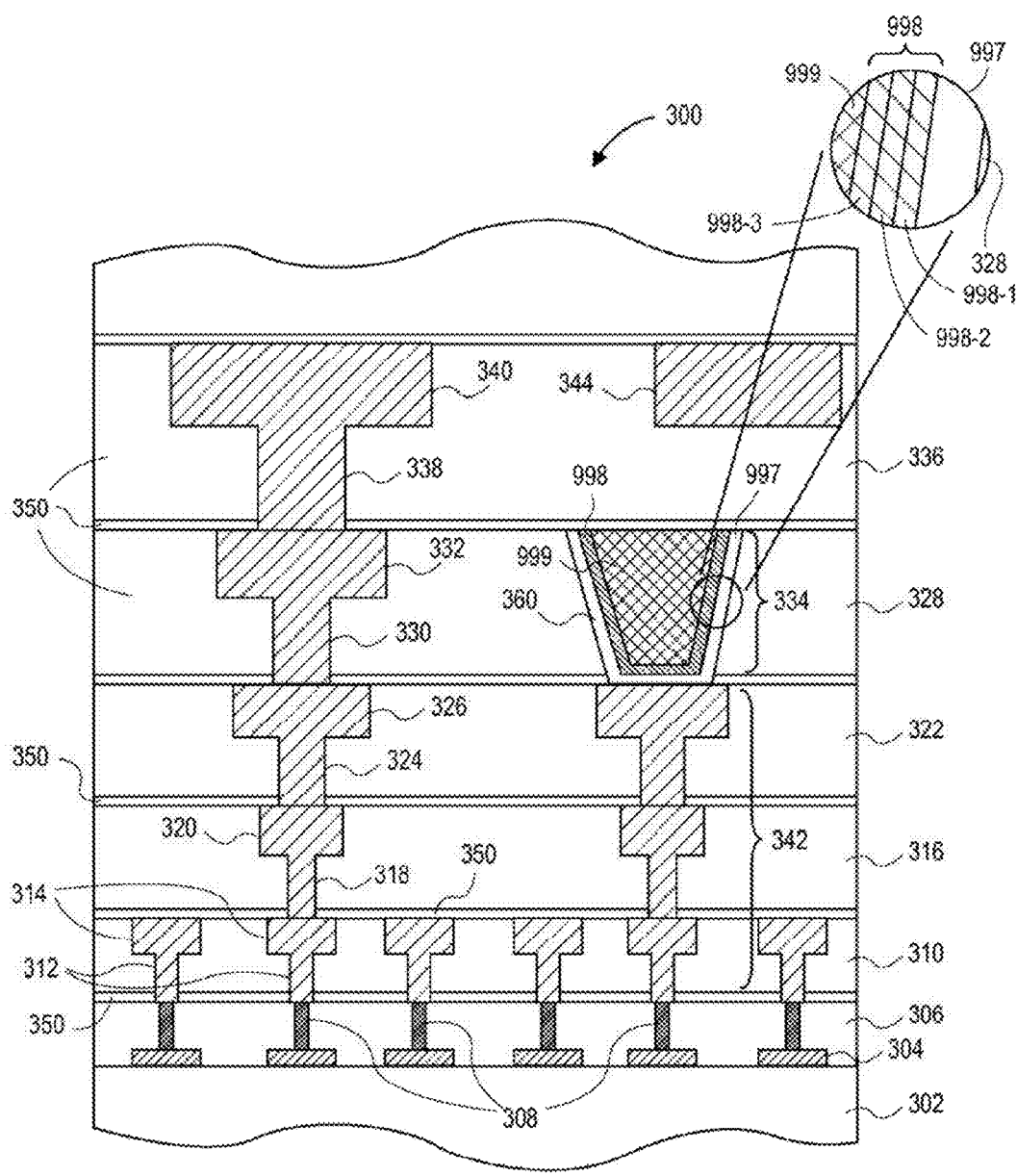
FIG. 3 illustrates a cross-sectional view of a capacitor formed in a single dielectric layer housing fourth-level metal wiring, in accordance with an embodiment of the present invention.

Referring to FIG. 3, a semiconductor structure 300 includes a plurality of semiconductor devices 304 disposed in or above a substrate 302. A first dielectric layer 306 is disposed above the plurality of semiconductor devices 304 and has disposed therein contacts 308 electrically coupled to the plurality of semiconductor devices 304.

A second dielectric layer 310 is disposed above the first dielectric layer 306 and has disposed therein a first metal wiring 314 and one or more vias 312 coupling the first metal wiring 314 to the contacts 308. A third dielectric layer 316 is disposed above the second dielectric layer 310 and has disposed therein a second metal wiring 320 and one or more vias 318 coupling the second metal wiring 320 to the first metal wiring 314. A fourth dielectric layer 322 is disposed above the third dielectric layer 316 and has disposed therein a third metal wiring 326 and one or more vias 324 coupling the third metal wiring 326 to the second metal wiring 320. A fifth dielectric layer 328 is disposed above the fourth dielectric layer 322 and has disposed therein a fourth metal wiring 332 and one or more vias 330 coupling the fourth metal wiring 332 to the third metal wiring 326.

Fifth dielectric layer 328 also has disposed therein at least a portion of a metal-insulator-metal (MIM) capacitor 334. The MIM capacitor 334 is adjacent to the fourth metal wiring 332. The MIM capacitor is electrically coupled to one or more of the semiconductor devices 304, e.g., by a stack 342 of metal wirings and vias and through to a contact 308. A sixth dielectric layer 336 is disposed above the fifth dielectric layer 328 and has disposed therein a fifth metal wiring 340 and one or more vias 338 coupling the fifth metal wiring 340 to the fourth metal wiring 332. In an embodiment, the MIM capacitor 334 is disposed in the fifth dielectric layer 328, but not the fourth or sixth dielectric layers 322 or 336, respectively, as is depicted in FIG. 3. As is also depicted in FIG. 3, a metal wiring 344 may be disposed above the MIM capacitor 334, but need not be coupled with the MIM capacitor 334.

Figure 4:
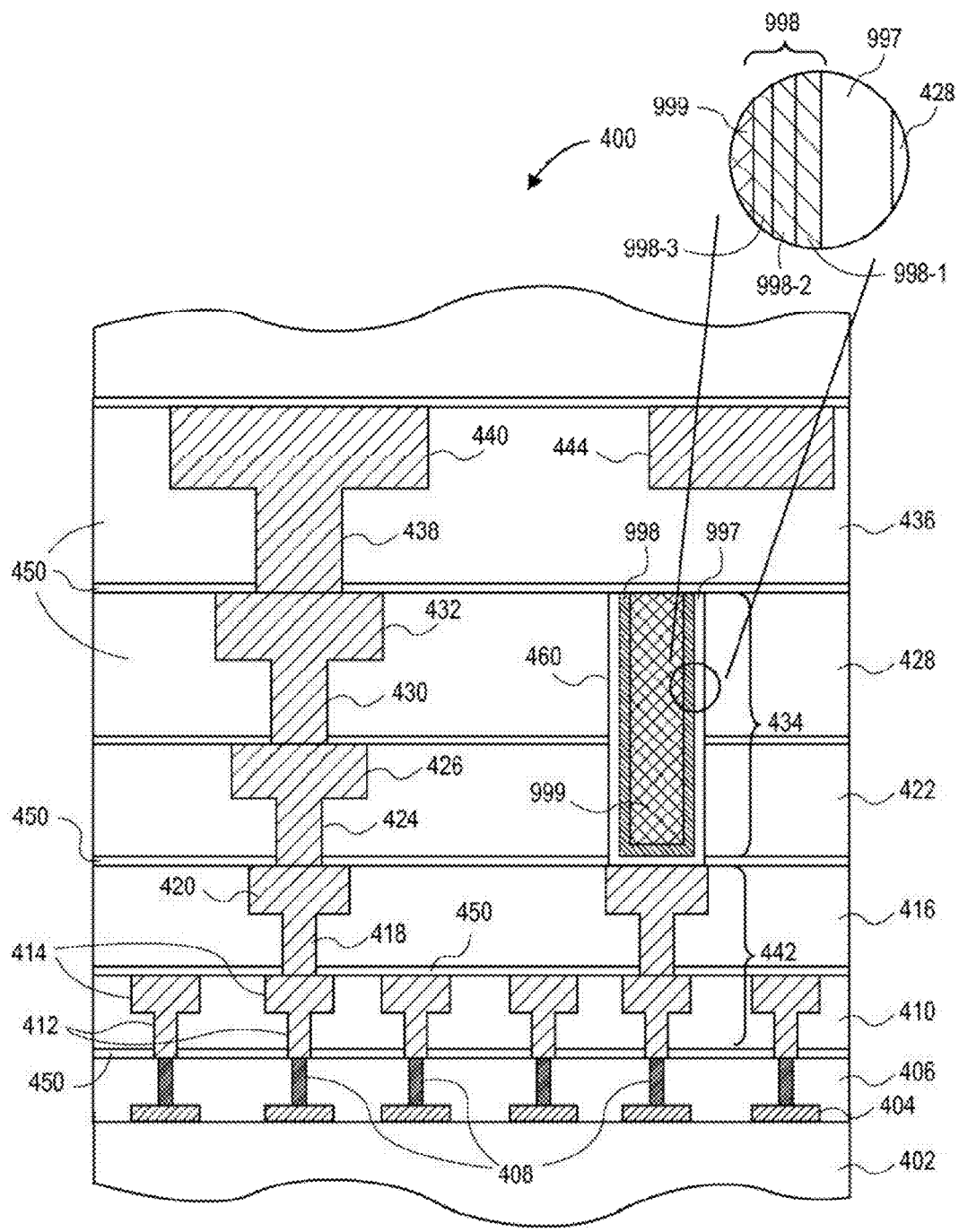
FIG. 4 illustrates a cross-sectional view of a capacitor formed in the two dielectric layers housing third-level and fourth-level metal wiring, in accordance with an embodiment of the present invention.

In another example, FIG. 4 illustrates a cross-sectional view of a capacitor formed in the two dielectric layers housing third-level and fourth-level metal wiring, in accordance with an embodiment of the present invention.

Referring to FIG. 4, a semiconductor structure 400 includes a plurality of semiconductor devices 404 disposed in or above a substrate 402. A first dielectric layer 406 is disposed above the plurality of semiconductor devices 404 and has disposed therein contacts 408 electrically coupled to the plurality of semiconductor devices 404.

A second dielectric layer 410 is disposed above the first dielectric layer 406 and has disposed therein a first metal wiring 414 and one or more vias 412 coupling the first metal wiring 414 to the contacts 408. A third dielectric layer 416 is disposed above the second dielectric layer 410 and has disposed therein a second metal wiring 420 and one or more vias 418 coupling the second metal wiring 420 to the first metal wiring 414. A fourth dielectric layer 422 is disposed above the third dielectric layer 416 and has disposed therein a third metal wiring 426 and one or more vias 424 coupling the third metal wiring 426 to the second metal wiring 420. A fifth dielectric layer 428 is disposed above the fourth dielectric layer 422 and has disposed therein a fourth metal wiring 432 and one or more vias 430 coupling the fourth metal wiring 432 to the third metal wiring 426.

Fifth dielectric layer 428 also has disposed therein at least a portion of a metal-insulator-metal (MIM) capacitor 434. The MIM capacitor 434 is adjacent to the fourth metal wiring 432. The MIM capacitor is electrically coupled to one or more of the semiconductor devices 404, e.g., by a stack 442 of metal wirings and vias and through to a contact 408. A sixth dielectric layer 436 is disposed above the fifth dielectric layer 428 and has disposed therein a fifth metal wiring 440 and one or more vias 438 coupling the fifth metal wiring 440 to the fourth metal wiring 432. In an embodiment, another portion of the MIM capacitor 434 is disposed in the fourth dielectric layer 422, adjacent to the third metal wiring 426, but no portion of the MIM capacitor 434 is disposed in the third or the sixth dielectric layers 416 or 436, respectively, as is depicted in FIG. 4. As is also depicted in FIG. 4, a metal wiring 444 may be disposed above the MIM capacitor 434, but need not be coupled with the MIM capacitor 434.

Referring to both FIGS. 3 and 4, in an embodiment, at least a portion of the fourth metal wiring 332 or 432 is electrically coupled to one or more semiconductor devices 308 or 408 included in a logic circuit, and the MIM capacitor 334 or 434 is an embedded dynamic random access memory (eDRAM) capacitor. In an embodiment, semiconductor structure 300 or 400 further includes a plurality of etch-stop layers 350 or 450, respectively. As shown, an etch-stop layer may be disposed between each of the first (306 or 406), second (310 or 410), third (316 or 416), fourth (322 or 422), fifth (328 or 428) and sixth (336 or 436) dielectric layers.

In an embodiment, the MIM capacitor 334 or 434 is disposed in a trench 360 or 460, respectively, disposed in at least the fifth dielectric layer 328 or 428. In one such embodiment, the MIM capacitor 334 or 434 includes a cup-shaped metal plate 997 disposed along the bottom and sidewalls of the trench 360 or 460. An insulator stack 998 is disposed on and conformal with the cup-shaped metal plate 997. In one embodiment, as depicted in FIG. 3, the insulator stack 998 is composed of a plurality of metals oxide layers, e.g., 998-1, 998-2, and 998-3, such as the groupings of metal oxide layers described in association with FIGS. 2A-2C. A trench-fill metal plate 999 is disposed on the insulator stack 998. The insulator stack 998 isolates the trench-fill metal plate 999 from the cup-shaped metal plate 997. In a specific embodiment, the sidewalls of the trench have a vertical or near-vertical profile, as is depicted for trench 460 of FIG. 4. In another specific embodiment, the sidewalls of the trench taper outward from the bottom to the top of the fifth dielectric layer 328 or 428, as is depicted for trench 360 of FIG. 3.

Materials or structural details for the features of semiconductor structures 300 and 400 of FIGS. 3 and 4, respectively, may be such as described above for semiconductor structures 200A, 200B and 200C.

It is to be understood that, in other embodiments, additional single or multiple layers of dielectric layers and/or metal lines may be formed below or above MIM capacitors 334 or 434. Also, in other embodiments, single or multiple layers of dielectric layers and/or metal lines may be removed from below or above MIM capacitors 334 or 434. In other embodiments, MIM capacitors 334 or 434 are formed in additional one or more layers of dielectric layers. In one exemplary embodiment, in reference to FIG. 4 (although not shown), another portion of the MIM capacitor 434 is disposed in both the fourth 422 and sixth 436 dielectric layers, adjacent to the third 426 and fifth 440 metal wirings. In one such embodiment, however, no portion of the MIM capacitor is disposed in the third dielectric layer 416.

Atomic layer deposition (ALD) may be used to form one or more layers of titanium oxide for use in an insulator stack of a MIM capacitor. The layer(s) of titanium oxide may be deposited at various substrate temperatures, e.g., typically between 250 and 350 degrees Celsius. An assortment of titanium (Ti) chemical precursors may be used for ALD of a titanium oxide layer. The precursors may be maintained at temperatures of less than 100 degrees Celsius, and may be reacted with deionized (DI) water or oxygen gas/plasma. Nitrogen or argon carrier gas may also be used, and various pulse/purge schemes and times may be employed depending on chemical precursor deposition conditions. The following exemplifies the fabrication of a MIM capacitor having a plurality of metal oxide layers, one or more of which may be a titanium oxide layer.

Figure 5:
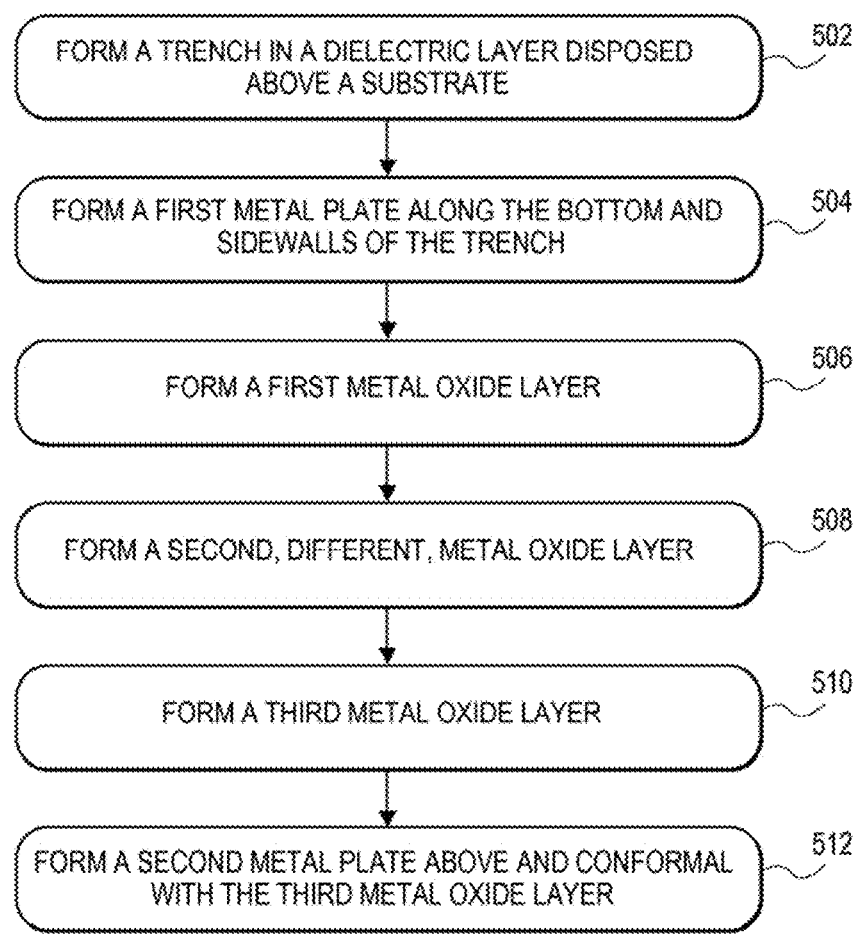
FIG. 5 is a Flowchart representing operations in a method of forming a MIM capacitor with an insulator stack having a plurality of metal oxide layers, in accordance with an embodiment of the present invention.

Thus, in one or more embodiments of the present invention, a method of fabricating an embedded MIM capacitor for semiconductor devices is provided. For example, FIG. 5 is a Flowchart 500 representing operations in a method of forming a MIM capacitor with an insulator stack having a plurality of metal oxide layers, in accordance with an embodiment of the present invention.

Referring to operation 502 of Flowchart 500, a trench is formed in a dielectric layer disposed above a substrate. In one embodiment, the trench has sidewalls with a vertical or near-vertical profile. In another embodiment, the trench has sidewalls that taper outward from the bottom of the dielectric layer to the top of the dielectric layer.

Referring to operation 504 of Flowchart 500, a first metal plate of the capacitor is formed along the bottom and sidewalls of the trench.

Referring to operation 506 of Flowchart 500, a first metal oxide layer of an insulator stack of the capacitor is formed above and conformal with the first metal plate. In an embodiment, forming the first metal oxide layer includes forming a layer of titanium oxide (TiO$_x$, where x is approximately in the range of 1-2) by atomic layer deposition (ALD). In one such embodiment, the ALD process involves depositing at a substrate temperature approximately in the range of 250 and 350 degrees Celsius. In another such embodiment, the ALD process involves reacting a titanium-containing precursor, maintained at a temperature less than approximately 100 degrees Celsius, with water (H$_2$O) or an oxygen-based gas or plasma. In a specific such embodiment, the titanium-containing precursor is delivered with a nitrogen (N$_2$) or argon (Ar) carrier gas. In one embodiment, the layer of titanium oxide is formed by reacting titanium chloride (TiCl$_4$) with H$_2$O. In one embodiment, the layer of titanium oxide is formed to a thickness approximately in the range of 0.5-20 nanometers.

Referring to operation 508 of Flowchart 500, a second, different, metal oxide layer of the insulator stack of the capacitor is formed above and conformal with the first metal oxide layer. In an embodiment, the second metal oxide layer is composed of a material such as, but not limited to, hafnium oxide (HfO$_2$), zirconium oxide (ZrO$_2$), or a combination thereof. In an embodiment, the second metal oxide layer has a dielectric constant lower than the dielectric constant of the first metal oxide layer and has a band gap greater than the band gap of the first metal oxide layer.

Referring to operation 510 of Flowchart 500, a third metal oxide layer of the insulator stack of the capacitor is formed above and conformal with the second metal oxide layer. In an embodiment, forming the third metal oxide layer includes forming a layer of titanium oxide (TiO$_x$, where x is approximately in the range of 1-2) by atomic layer deposition (ALD). In one such embodiment, the ALD process involves depositing at a substrate temperature approximately in the range of 250 and 350 degrees Celsius. In another such embodiment, the ALD process involves reacting a titanium-containing precursor, maintained at a temperature less than approximately 100 degrees Celsius, with water (H$_2$O) or an oxygen-based gas or plasma. In a specific such embodiment, the titanium-containing precursor is delivered with a nitrogen (N$_2$) or argon (Ar) carrier gas. In one embodiment, the layer of titanium oxide is formed by reacting titanium chloride (TiCl$_4$) with H$_2$O. In one embodiment, the layer of titanium oxide is formed to a thickness approximately in the range of 0.5-20 nanometers. In an embodiment, the third metal oxide layer is substantially the same as the first metal oxide layer.

Referring to operation 512 of Flowchart 500, a second metal plate of the capacitor is formed above and conformal with the third metal oxide layer.

In an embodiment, forming the MIM capacitor includes electrically coupling the MIM capacitor to one or more semiconductor devices. In one embodiment, forming the MIM capacitor includes forming an embedded dynamic random access memory (eDRAM) capacitor.

In an embodiment, the method includes forming a capacitor and metal wiring integrated in a same dielectric layer. Other materials or structural details for the features of the fabricated semiconductor structure may be such as described above for semiconductor structures 200A, 200B, 200C, 300 and 400.

The embedded DRAM described herein may be included on a first chip and packaged with a microprocessor on a second chip. Alternatively, the embedded DRAM described herein may be included on the same chip as a microprocessor to provide a monolithic fabrication process. In an embodiment, an eDRAM chip is packaged with a microprocessor to improve performance or to reduce power consumption, or both.

Figure 6:
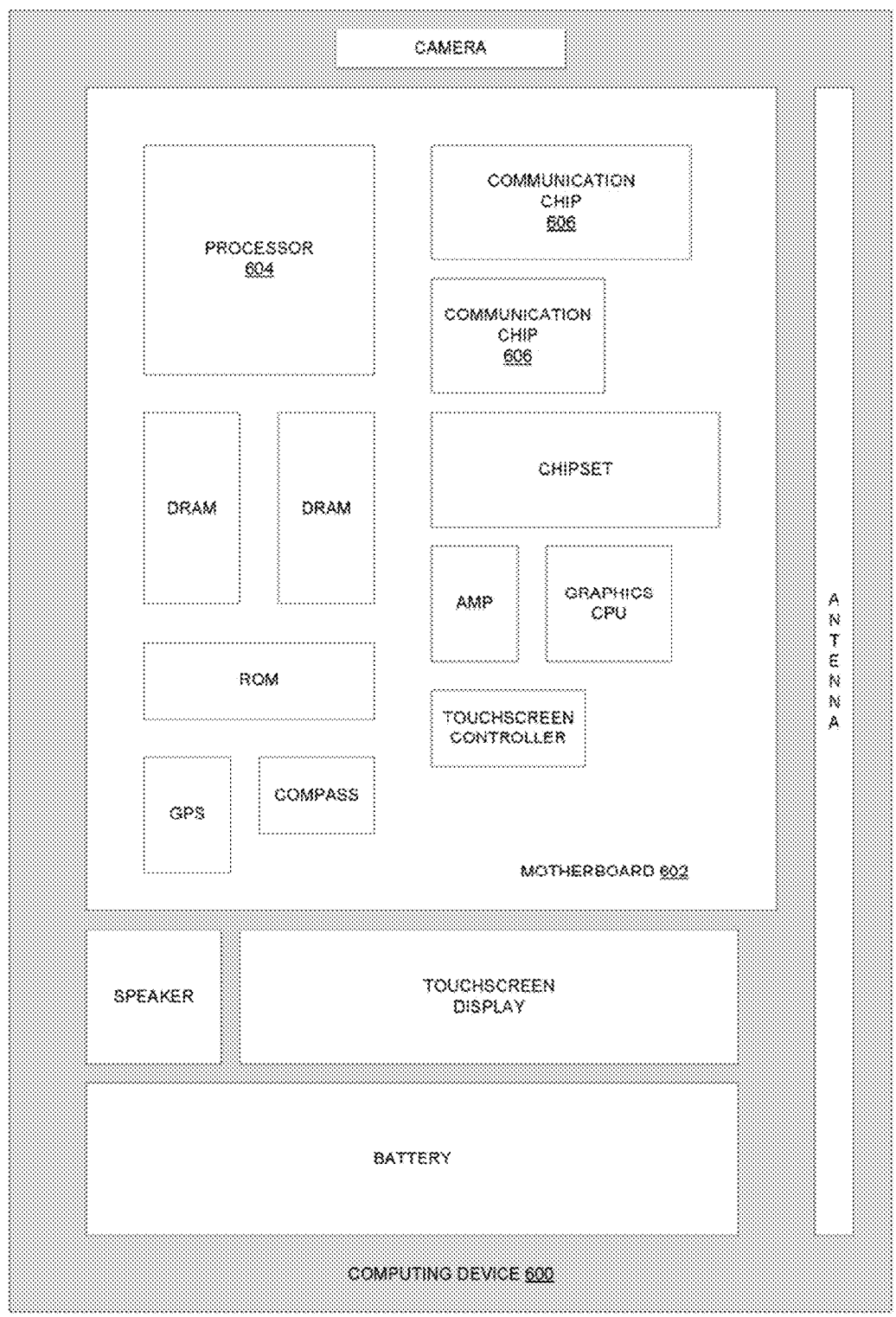
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 706 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as nanowire transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as nanowire transistors built in accordance with implementations of the invention.

In further implementations, another component housed within the computing device 600 may contain an integrated circuit die that includes one or more devices, such as nanowire transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, MIM capacitors with insulator stacks having a plurality of metal oxide layers have been disclosed. In an embodiment, a MIM capacitor for a semiconductor device includes a trench disposed in a dielectric layer disposed above a substrate. A first metal plate is disposed along the bottom and sidewalls of the trench. An insulator stack is disposed above and conformal with the first metal plate. The insulator stack includes a first metal oxide layer having a first dielectric constant and a second metal oxide layer having a second dielectric constant. The first dielectric constant is higher than the second dielectric constant. The MIM capacitor also includes a second metal plate disposed above and conformal with the insulator stack.

What is claimed is:

1. A semiconductor structure, comprising:
  a plurality of semiconductor devices disposed in or above a substrate;
  one or more dielectric layers disposed above the plurality of semiconductor devices;
  metal wiring disposed in each of the dielectric layers and electrically coupled to one or more of the semiconductor devices; and
  a metal-insulator-metal (MIM) capacitor disposed in a trench disposed in at least one of the dielectric layers, adjacent to the metal wiring of the at least one of the dielectric layers, the MIM capacitor electrically coupled to one or more of the semiconductor devices and comprising:
    a first metal plate disposed along the bottom and sidewalls of the trench, the first metal plate comprising a first inner cup-shaped conductive layer disposed on a first outer cup-shaped conductive layer, wherein the first inner cup-shaped conductive layer is separate and distinct from the first outer cup-shaped conductive layer;
    an insulator stack disposed above and conformal with the first metal plate, the insulator stack comprising a first metal oxide layer conformal with and in contact with the first metal plate and comprising titanium oxide, a second metal oxide layer conformal with and in contact with the first metal oxide layer and comprising hafnium oxide or zirconium oxide, and a third metal oxide layer conformal with and in contact with the second metal oxide layer and comprising titanium oxide; and
    a second metal plate disposed above and conformal with and in contact with the third metal oxide layer of the insulator stack, the second metal plate comprising a second outer cup-shaped conductive layer disposed on a second inner cup-shaped conductive layer, wherein the second outer cup-shaped conductive layer is separate and distinct from the second inner cup-shaped conductive layer, and wherein the second metal oxide layer of the insulator stack is not in contact with the first metal plate and is not in contact with the second metal plate.

2. The semiconductor structure of claim 1, wherein at least a portion of the metal wiring is electrically coupled to one or more semiconductor devices included in a logic circuit, and wherein the MIM capacitor is an embedded dynamic random access memory (eDRAM) capacitor.

3. The semiconductor structure of claim 1, wherein the MIM capacitor is disposed in only one of the dielectric layers.

4. The semiconductor structure of claim 1, wherein the MIM capacitor is disposed in only two of the dielectric layers, adjacent to the metal wiring of each of the two dielectric layers and also adjacent to a via coupling the metal wiring of each of the two dielectric layers.

5. The semiconductor structure of claim 1, wherein the MIM capacitor is disposed in more than two of the dielectric layers, adjacent to the metal wiring of all of the more than two dielectric layers.

6. The semiconductor structure of claim 1, wherein the sidewalls of the trench comprise a vertical or near-vertical profile.

7. The semiconductor structure of claim 1, wherein the sidewalls of the trench taper outward from the bottom of the at least one of the dielectric layers to the top of the at least one of the dielectric layers.

8. The semiconductor structure of claim 1, wherein the thickness of the second metal oxide layer is approximately three times the thickness of each of the first and third metal oxide layers.

9. A semiconductor structure, comprising:
  a plurality of semiconductor devices disposed in or above a substrate;
  one or more dielectric layers disposed above the plurality of semiconductor devices;
  metal wiring disposed in each of the dielectric layers and electrically coupled to one or more of the semiconductor devices; and
  a metal-insulator-metal (MIM) capacitor disposed in a trench disposed in at least one of the dielectric layers, adjacent to the metal wiring of the at least one of the dielectric layers, the MIM capacitor electrically coupled to one or more of the semiconductor devices and comprising:
    a first metal plate disposed along the bottom and sidewalls of the trench;
    an insulator stack disposed above and conformal with the first metal plate, the insulator stack comprising a first metal oxide layer conformal with and in contact with the first metal plate and comprising titanium oxide, a second metal oxide layer conformal with and in contact with the first metal oxide layer and comprising hafnium oxide or zirconium oxide, and a third metal oxide layer conformal with and in contact with the second metal oxide layer and comprising titanium oxide; and
    a second metal plate disposed above and conformal with and in contact with the third metal oxide layer of the insulator stack, wherein the second metal oxide layer of the insulator stack is not in contact with the first metal plate and is not in contact with the second metal plate.

10. The semiconductor structure of claim 9, wherein at least a portion of the metal wiring is electrically coupled to one or more semiconductor devices included in a logic circuit, and wherein the MIM capacitor is an embedded dynamic random access memory (eDRAM) capacitor.

11. The semiconductor structure of claim 9, wherein the MIM capacitor is disposed in only one of the dielectric layers.

12. The semiconductor structure of claim 9, wherein the MIM capacitor is disposed in only two of the dielectric layers, adjacent to the metal wiring of each of the two dielectric layers and also adjacent to a via coupling the metal wiring of each of the two dielectric layers.

13. The semiconductor structure of claim 9, wherein the MIM capacitor is disposed in more than two of the dielectric layers, adjacent to the metal wiring of all of the more than two dielectric layers.

14. The semiconductor structure of claim 9, wherein the sidewalls of the trench comprise a vertical or near-vertical profile.

15. The semiconductor structure of claim 9, wherein the sidewalls of the trench taper outward from the bottom of the at least one of the dielectric layers to the top of the at least one of the dielectric layers.

16. The semiconductor structure of claim 9, wherein the thickness of the second metal oxide layer is approximately three times the thickness of each of the first and third metal oxide layers.

17. An embedded metal-insulator-metal (MIM) capacitor for a semiconductor device, the capacitor comprising:
a trench disposed in a dielectric layer disposed above a substrate;
a first metal plate disposed along the bottom and sidewalls of the trench;
an insulator stack disposed above and conformal with the first metal plate, the insulator stack comprising a first metal oxide layer conformal with and in contact with the first metal plate and comprising titanium oxide, a second metal oxide layer conformal with and in contact with the first metal oxide layer and comprising hafnium oxide or zirconium oxide, and a third metal oxide layer conformal with and in contact with the second metal oxide layer and comprising titanium oxide; and
a second metal plate disposed above and conformal with the insulator stack.

18. The embedded MIM capacitor of claim 17, wherein the second metal oxide layer comprises hafnium oxide.

19. The embedded MIM capacitor of claim 17, wherein the second metal oxide layer comprises zirconium oxide.

20. The embedded MIM capacitor of claim 17, wherein the first metal oxide layer has a thickness approximately in the range of 0.5-20 nanometers.

21. The embedded MIM capacitor of claim 17, wherein the thickness of the second metal oxide layer is approximately three times the thickness of the first metal oxide layer.

22. The embedded MIM capacitor of claim 17, wherein the first metal plate comprises a first inner cup-shaped conductive layer disposed on a first outer cup-shaped conductive layer, the first metal oxide layer disposed on the first inner cup-shaped conductive layer, and wherein the second metal plate comprises a second outer cup-shaped conductive layer disposed on a second inner cup-shaped conductive layer, the second inner cup-shaped conductive layer disposed on the third metal oxide layer.

23. The embedded MIM capacitor of claim 22, wherein the first outer cup-shaped conductive layer comprises tantalum (Ta), the first inner cup-shaped conductive layer comprises titanium nitride (TiN), the second inner cup-shaped conductive layer comprises tantalum aluminum carbide (TaAlC), and the second outer cup-shaped conductive layer comprises tantalum (Ta), and wherein the embedded MIM capacitor further comprises a conductive trench-fill layer.

24. A method of fabricating an embedded metal-insulator-metal (MIM) capacitor, the method comprising:
forming a trench in a dielectric layer disposed above a substrate;
forming a first metal plate along the bottom and sidewalls of the trench;
forming a first metal oxide layer above and conformal with and in contact with the first metal plate, the first metal oxide layer comprising titanium oxide;
forming a second metal oxide layer above and conformal with and in contact with the first metal oxide layer, the second metal oxide layer comprising hafnium oxide or zirconium oxide;
forming a third metal oxide layer above and conformal with and in contact with the second metal oxide layer, the third metal oxide layer comprising titanium oxide; and
forming a second metal plate above and conformal with the third metal oxide layer.

25. The method of claim 24, wherein the second metal oxide layer comprises hafnium oxide.

26. The method of claim 24, wherein the second metal oxide layer comprises zirconium oxide.

27. The method of claim 24, wherein forming each of the first and third metal oxide layers comprises forming the titanium oxide by atomic layer deposition (ALD).

28. The method of claim 27, wherein forming the titanium oxide by ALD comprises depositing at a substrate temperature approximately in the range of 250 and 350 degrees Celsius.

29. The method of claim 27, wherein forming the titanium oxide by ALD comprises reacting a titanium-containing precursor, maintained at a temperature less than approximately 100 degrees Celsius, with water ($H_2O$) or an oxygen-based gas or plasma.

30. The method of claim 29, wherein reacting the titanium-containing precursor comprises delivering the precursor with a nitrogen ($N_2$) or argon (Ar) carrier gas.

31. The method of claim 27, wherein forming the titanium oxide by ALD comprises forming the titanium oxide to a thickness approximately in the range of 0.5-20 nanometers.

32. The method of claim 24, wherein forming the trench comprises forming the sidewalls of the trench to have a vertical or near-vertical profile.

33. The method of claim 24, wherein forming the trench comprises forming the sidewalls of the trench to taper outward from the bottom of the dielectric layer to the top of the dielectric layer.

34. The semiconductor structure of claim 1, wherein the second metal oxide layer comprises hafnium oxide.

35. The semiconductor structure of claim 1, wherein the second metal oxide layer comprises zirconium oxide.

36. The semiconductor structure of claim 9, wherein the second metal oxide layer comprises hafnium oxide.

37. The semiconductor structure of claim 9, wherein the second metal oxide layer comprises zirconium oxide.

* * * * *